(12) United States Patent
Hong

(10) Patent No.: US 6,204,113 B1
(45) Date of Patent: *Mar. 20, 2001

(54) METHOD OF FORMING DATA STORAGE CAPACITORS IN DYNAMIC RANDOM ACCESS MEMORY CELLS

(75) Inventor: Gary Hong, Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/756,914

(22) Filed: Nov. 26, 1996

(30) Foreign Application Priority Data

Aug. 7, 1996 (TW) ................................. 85109606

(51) Int. Cl.[7] ................................................. H01L 21/8242
(52) U.S. Cl. .......................... 438/253; 438/254; 438/396; 438/397
(58) Field of Search ........................... 257/306; 438/253, 438/396, 254, 397, 255, 398

(56) References Cited

U.S. PATENT DOCUMENTS

| 5,217,914 | * | 6/1993 | Matsumoto et al. | 438/396 |
| 5,274,258 | * | 12/1993 | Ahn | 257/308 |
| 5,330,614 | * | 7/1994 | Ahn | 438/396 |
| 5,399,518 | * | 3/1995 | Sim et al. | 438/396 |
| 5,438,010 | * | 8/1995 | Saeki | 438/396 |
| 5,438,013 | * | 8/1995 | Kim et al. | 438/396 |
| 5,444,005 | * | 8/1995 | Kim et al. | 438/396 |
| 5,464,787 | * | 11/1995 | Ryou | 438/396 |
| 5,482,886 | * | 1/1996 | Park et al. | 438/397 |
| 5,508,222 | * | 4/1996 | Sakao | 438/396 |
| 5,523,542 | * | 6/1996 | Chen et al. | 438/396 |
| 5,620,918 | * | 4/1997 | Kondoh | 438/396 |

FOREIGN PATENT DOCUMENTS

| 5-226601 | 9/1993 | (JP) . |
| 4-249363 | 12/1993 | (JP) . |
| 6-338593 | 12/1994 | (JP) . |
| 7-169855 | 1/1996 | (JP) . |

* cited by examiner

Primary Examiner—Carl Whitehead, Jr.
Assistant Examiner—Toniae M. Thomas
(74) Attorney, Agent, or Firm—Venable; Norman N. Kunitz

(57) ABSTRACT

A method of forming data storage capacitors in DRAM cells, which data storage capacitors each have an increased surface area for the charge storage plates of the capacitors in order to increase the capacitance. The individual method allows ULSI (Ultra Large Scale Integration) DRAMs, although reduced in circuit element size, to be formed with data storage capacitors having a sufficiently large capacitance to reliably retain electric charges. In this method, a double-trench structure is formed in at least two overlaying conductive layers serving as a bottom plate of the data storage capacitor. A dielectric layer is then formed over the bottom plate, and subsequently, another conductive layer serving as a top plate of the data storage capacitor is formed over the dielectric layer. In this semiconductor structure, the double-trench structure in the data storage capacitor increases the surface area of the bottom plate, thus proportionally increasing the capacitance of the data storage capacitor.

19 Claims, 5 Drawing Sheets

METHOD OF FORMING DATA STORAGE CAPACITORS IN DYNAMIC RANDOM ACCESS MEMORY CELLS

BACKGROUND OF THE INVENTION

1. Field of the Invention

This invention relates to a semiconductor integrated circuit fabrication method. More particularly, the present invention relates to a method of forming data storage capacitors with an increased capacitance in a dynamic random access memory (DRAM) of the DRAM cells, so as to maintain a high data retaining capability even if the DRAM chip is reduced in size to achieve higher integration.

2. Description of Related Art

A dynamic random access memory (DRAM) is a volatile semiconductor read/write memory that is widely used as the primary memory in most computers. The information age constantly requires DRAMs with higher integration so as to meet the demands of ever more sophisticated next generation applications. Therefore, it is a continuous research effort in the semiconductor industry to develop DRAMs with higher-packing densities of memory cells in a single DRAM chip.

A single DRAM chip includes a plurality of memory cells, each including at least a MOS transistor and a data storage capacitor (hereinafter referred to as a data storage capacitor) connected in series with the MOS transistor. The data storage capacitor is used to retain electric charges representative of the binary data "0" and "1". These electric charges, however, will be gradually reduced in magnitude due to leakage. Therefore, periodic refreshing of these electric charges is required to enable the data storage capacitor to retain the binary data. It is usually desirable for the data storage capacitor to be formed with a sufficiently high capacitance so that electric charges can be reliably retained for an extended period of time. If the capacitance is too small, data stored in the DRAM cells could be easily lost within a short period of time.

Two approaches to increase the packing density of memory cells in a DRAM chip are presently used: (1) reduce the size of circuit elements of the DRAM chip, such as the length of interconnections and the width of gates of MOS transistors; and, (2) reduce the spacing between individual circuit elements. In future or next generation ULSI (Ultra Large Scale Integration) DRAMs, the data storage capacitors, or more specifically, the charge storage plates (electrodes) used to hold the electric charges will be proportionately reduced in size. It is known from fundamental circuit principles that the capacitance of a capacitor is proportional to the surface area of the charge storage plates. Therefore, a reduction in size of the data storage capacitors in DRAM cells will correspondingly reduce the capacitance of these data storage capacitors, causing these data storage capacitors to retain a reduced amount of electric charges. The binary data stored on the DRAM cells thus could be more easily and quickly lost due to leakage of the electric charges. To retain the data on the data storage capacitors, the DRAM cells need to be more frequently refreshed. However, during the refreshing period, read/write operations cannot be performed, thereby effectively reducing the performance of the DRAM cells. Therefore, in fabricating DRAM cells, it is always desirable to have high capacitance data storage capacitors.

FIG. 1 is a cross-section schematic view of a single DRAM cell having a data storage capacitor formed by a known conventional method. The DRAM cell is fabricated based on a silicon substrate 10, on whose outer major surface a field oxide layer 12 and a gate oxide layer 14 are formed. A first conductive layer, such as a doped polysilicon layer, is formed on the outer surface of the substrate and is then selectively removed to form a gate 16a and a metal contact 16b. Spacers 18a and 18b are then formed respectively on the sidewalls of the gate 16a and of the metal contact 16b. A pair of $N^+$ source/drain regions 20a and 20b are formed in the silicon substrate 10. An insulating layer 22 is formed over the outer surface of the substrate and then selectively removed to expose the source/drain region 20b.

To form a data storage capacitor for the DRAM cell, a conductive layer 24, a dielectric layer 26, and another conductive layer 28 successively are formed on the outer surface of the substrate, with the layer 24 in contact with the region 20b. Conductive layers 24 and 28 can be, for example, doped polysilicon layers which serve as two opposing electrodes for the data storage capacitor. It is a drawback of the foregoing data storage capacitor that, when the feature size of the DRAM chip is reduced to increase the integration of memory cells on a chip, the surface areas of the conductive layers 24 and 28 will also proportionately be reduced, thus causing a decrease in capacitance of the storage capacitors. This will substantially decrease the charge retaining capability of the data storage capacitor.

SUMMARY OF THE INVENTION

It is therefore an objective of the present invention to provide a method of forming data storage capacitors with increased capacitance in DRAM cells, so as to increase the data retaining capability of the DRAM cells.

In accordance with the foregoing and other objectives of the present invention, a new and improved method of forming a data storage capacitor in a DRAM cell is provided. In a method of the present invention, the first step is to prepare or provide a semiconductor substrate having at least a MOS transistor formed thereon and a first insulating layer formed over the MOS transistors and having an opening therethrough to expose one of the source/drain regions. The second step is to form a first conductive layer over the outer surface of the substrate, i.e., over the first insulating layer, and filling the opening. The next step is to form an insulating hump on the first conductive layer over the opening, which step preferably is carried out by forming a second insulating layer over the first conductive layer, and then selectively etching the second insulating layer to remove a selected part of the second insulating layer to form the insulating hump. The next step is to form a second conductive layer covering the first conductive layer and the insulating hump. Then a spacer of insulating material is formed on the sidewalls of a protruding portion of the second conductive layer that covers the insulating hump. The next step is to anisotropically etch the exposed portions of the first and second conductive layers using the spacer and the insulating hump as an etching mask to selectively remove part of the first and second conductive layers and to form at least a pair of trenches which extend into the first conductive layer to a given depth inside the region surrounded by the spacer and between the spacer and the insulating hump. Thereafter, the spacer and the insulating hump are removed from the substrate, and a dielectric layer covering the remaining parts of the first and second conductive layers is formed. Finally, a third conductive layer is formed over the dielectric layer.

In the semiconductor structure thus formed, the remaining part of the first and second conductive layers, the dielectric layer, and the third conductive layer in combination constitute the data storage capacitor of the DRAM cell. The double-trench structure in the data storage capacitor particularly increases the surface area of the bottom plate of the data storage capacitor, so that the capacitance of the data storage capacitor is also proportionally increased.

BRIEF DESCRIPTION OF DRAWINGS

This invention can be more fully understood by reading the subsequent detailed description of the preferred embodiments, with reference made to the accompanying drawings, wherein.

DETAILED DESCRIPTION OF PREFERRED EMBODIMENT

FIGS. 2A through 2H are schematic cross sectional views depicting the steps involved in the method according to the present invention for forming a data storage capacitor in a single DRAM cell.

Figure 1:
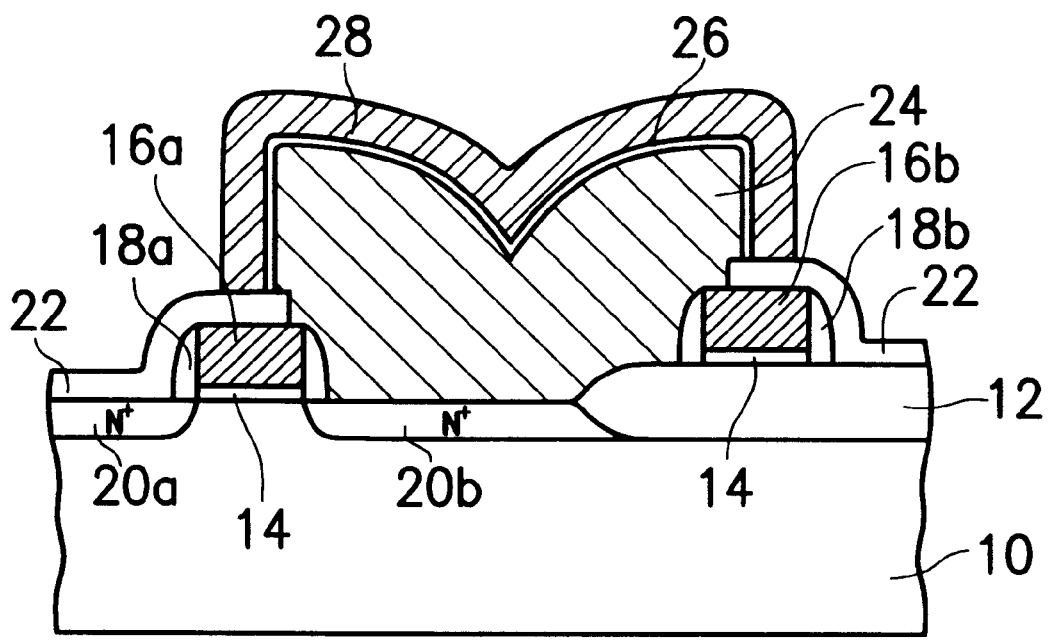
FIG. 1 is a cross-section schematic view of a single DRAM cell having a data storage capacitor formed of a single conventional method.
Figure 2A:
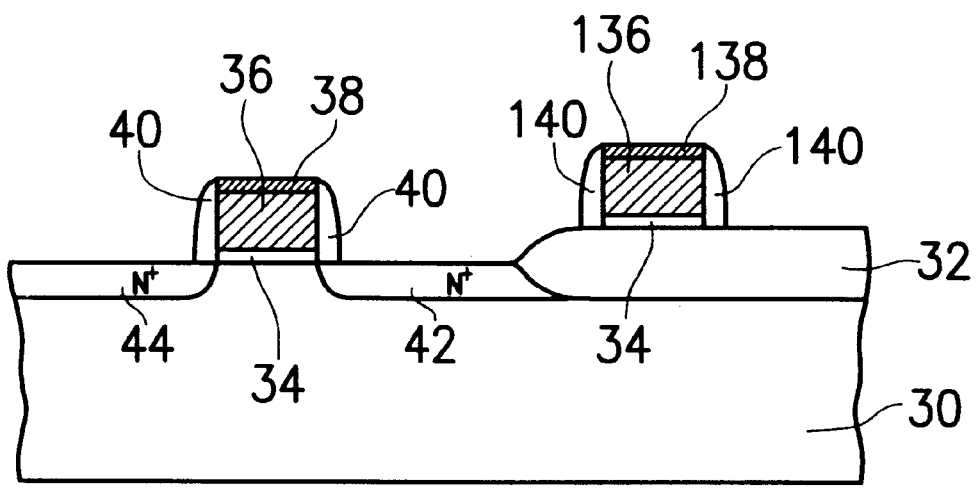
FIGS. 2A through 2H depict cross-section schematic views of a single DRAM cell illustrating the method steps involved in the method according to the present invention for forming a data storage capacitor with an increased capacitance in a DRAM cell.

Referring first to FIG. 2A, a DRAM cell is formed on a semiconductor substrate such as a silicon substrate 30. A field oxide layer 32 is formed on a selected part of the surface of the silicon substrate 30 so as to define an active area for a cell. Thereafter, a gate oxide layer 34 is formed on the outer surface of the substrate 30, including the layer 32 using conventional techniques. Conductive layers, such as a polysilicon layer and a metal silicide layer, are successively formed over the oxide layer 34 on the substrate 30, and then the gate oxide layer 34 and the successive conductive layers are selectively removed to form a gate 36 and an overlaying metal silicide layer 38, and also another metal contact 136 and metal silicide layer 138 on the remaining portion of the gate oxide layer 34. Spacers 40 of an insulating material, for example, silicon dioxide, are formed on respective sidewalls of the gate 36 the metal silicide layer 38, and spacers 140 are formed on respective sidewalls of the metal contact 136 and the metal silicide layer 138 and the underlying portion of the field oxide layer 32. Thereafter, a pair of N+ source/drain regions 42, 44 are formed in the silicon substrate 30 at its upper surface.

Figure 2B:
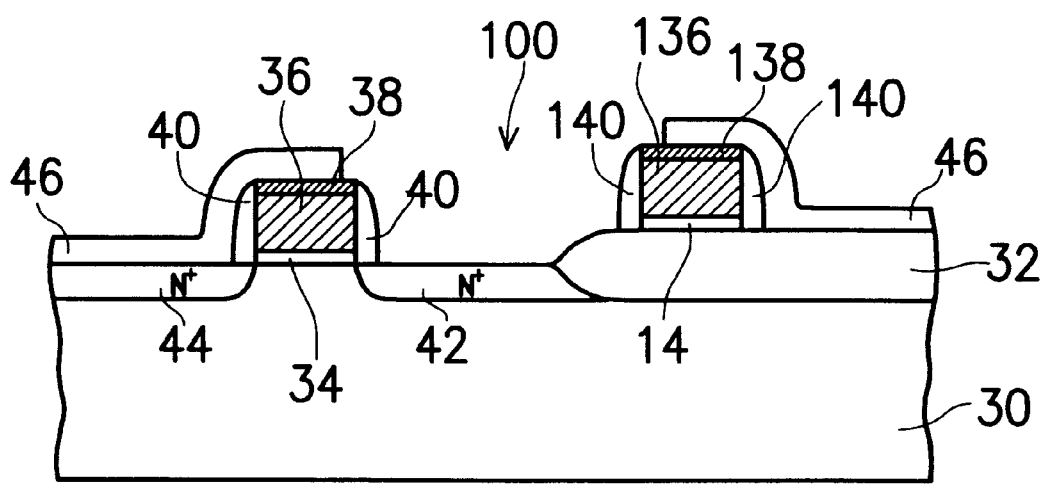

Referring now to FIG. 2B, a first insulating layer 46 is formed by depositing, for example, an oxide layer, over the entire outer surface of the substrate 30 and the other layers formed thereon. Thereafter, the layer 46 is subjected to an anisotropic etching process so as to remove a selected part of the oxide layer 46 to thereby form a self-aligned opening 100 in the layer 46 which exposes the source/drain region 42.

Figure 2C:
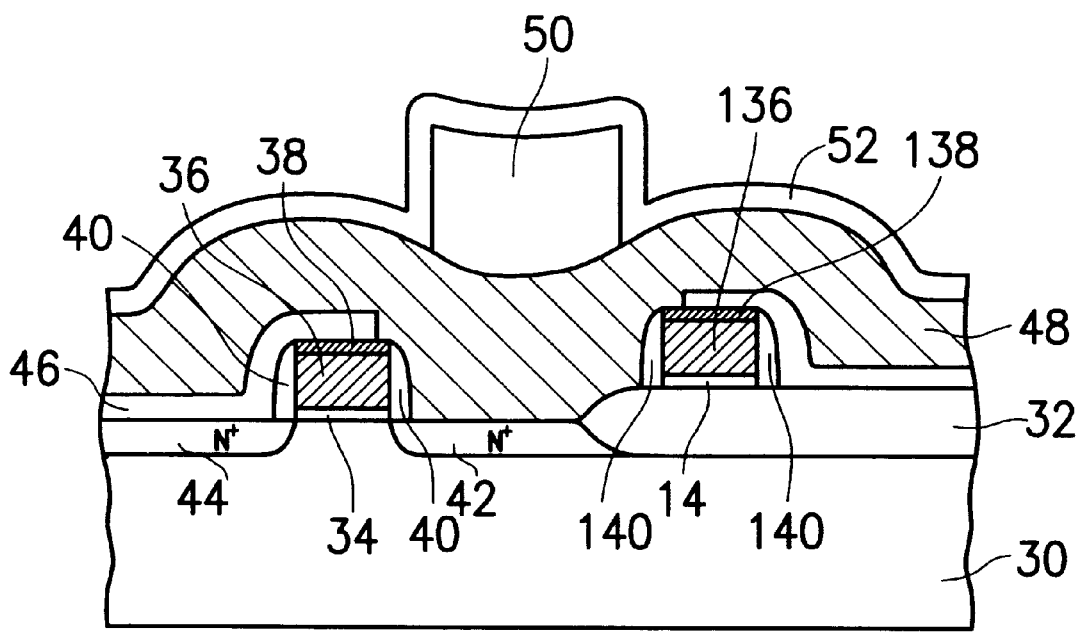

Turning now to FIG. 2C, in a subsequent process step, a conductive layer 48 such as a polysilicon layer, is deposited by a chemical-vapor deposition (CVD) to a thickness of 3,000 Å to 8,000 Å over the surface of the substrate. The polysilicon layer is doped with impurities so as to increase the conductivity thereof. An insulating hump 50 is then formed on the first conductive layer 48 at a position above the N+ source/drain region 42 by first forming an insulating layer, e.g., an oxide layer, on the surface of the conductive layer 48 and then conducting a conventional photolithographic and etching process so as to anisotropically etch away a selected part of the second insulating layer so that the hump 50 results. Subsequently, a further conductive layer 52, such as a doped polysilicon layer, is formed covering both the first conductive layer 48 and the insulating hump 50.

Figure 2D:
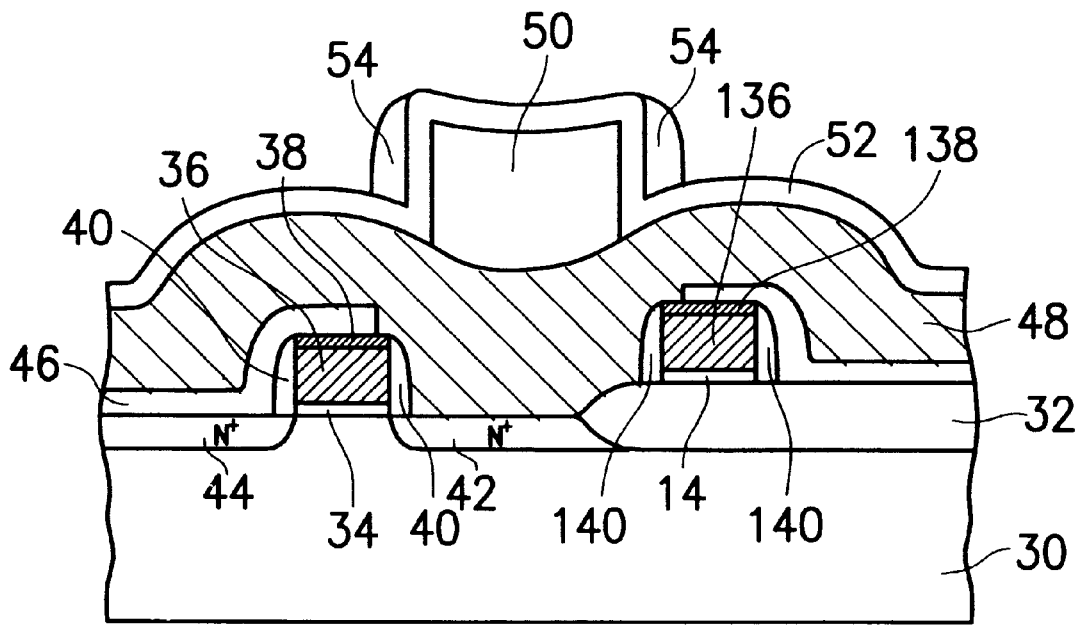

Thereafter, as shown in FIG. 2D, insulating material spacers 54, for example, of silicon dioxide, are formed on the sidewalls of the protruding portion of the second conductive layer 52 that covers the insulating hump 50.

Figure 2E:
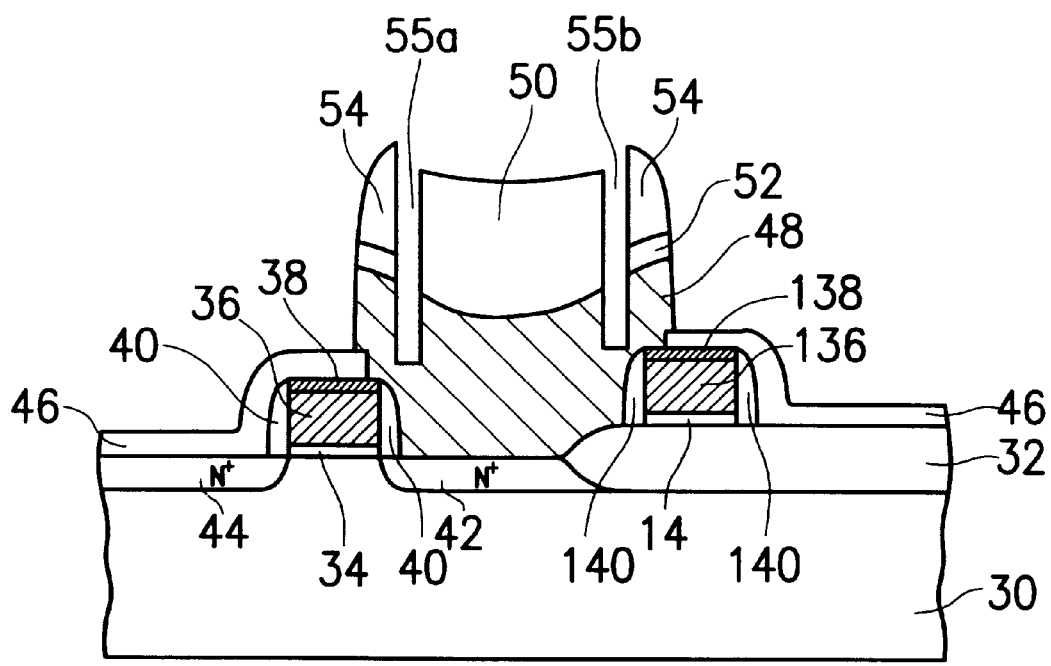

Referring next to FIG. 2E, the insulating hump 50 and the spacers 54 are used together as an etching mask for an anisotropic etching process so as to remove the unmasked portions of the conductive layers 48 and 52. The anisotropic etching process is controlled in such a way as to remove all portions of the conductive layers 48 and 52 that are located beyond the region bounded by the spacers 54 surrounding the insulating hump 50, but to a predetermined controlled depth not reaching the N+ source/drain regions 42 for the unmasked portions of the layers 48 and 52 located within the region bounded by the spacers 54, and between the spacers 54 and the hump 50, so as to form a pair of trenches 55a, 55b which extend into the conductive layer 48, e.g., to a depth corresponding substantially to the level of the layers, 38 and 138, as shown.

Figure 2F:
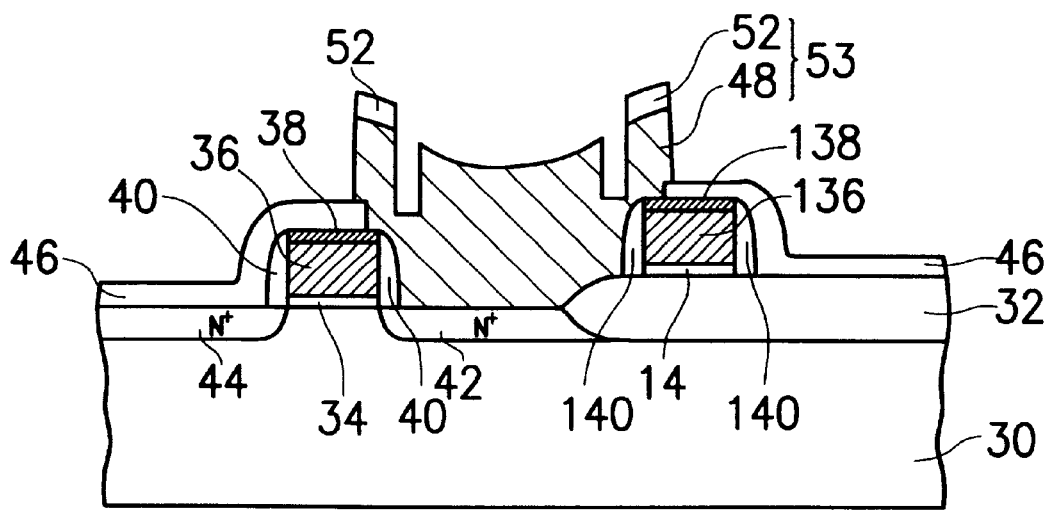

Thereafter, as shown in FIG. 2F, the insulating hump 50 and the insulating spacers 54 are removed so as to expose the remaining parts or portions of the conductive layers 48 and 52. The remaining parts of the conductive layers 48 and 52 are used together as the bottom plate (electrode) 53 for the data storage capacitor of the DRAM cell.

Figure 2G:
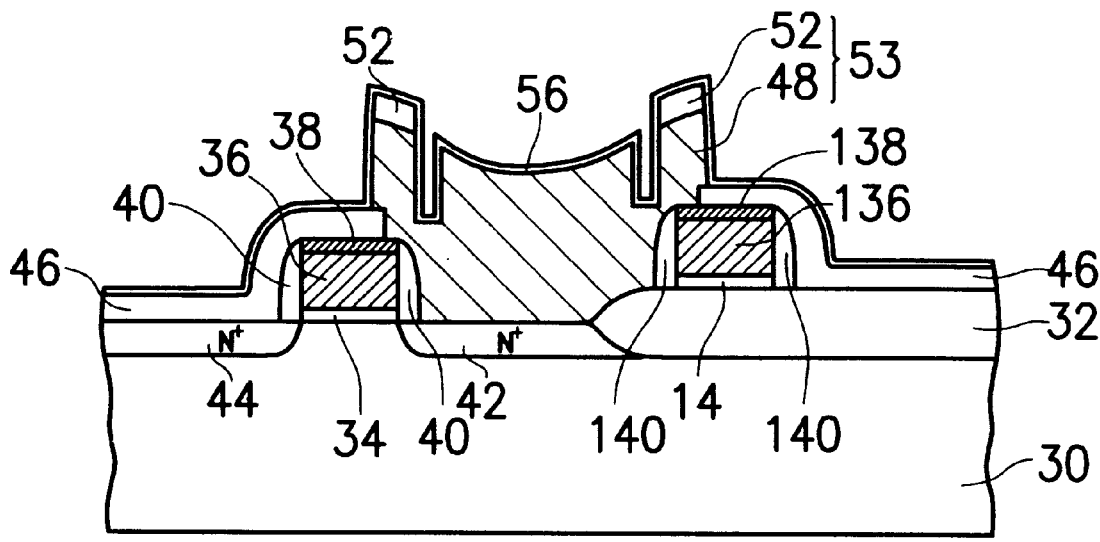

Referring next to FIG. 2G, a dielectric layer 56, such as a layer of silicon nitride/silicon dioxide (NO) or a layer of $Ta_2O_5$, is formed on the outer surface of the substrate to cover the bottom plate 53 of the data storage capacitor of the DRAM cell.

Figure 2H:
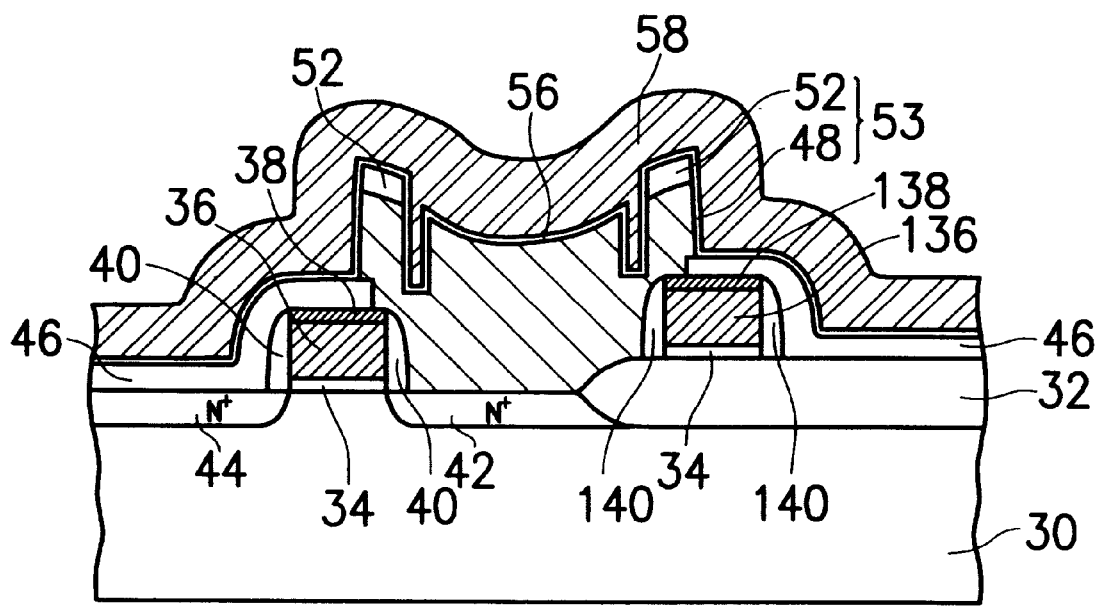

Referring finally to FIG. 2H, a further (third) conductive layer 58, such as a polysilicon layer, is deposited by a chemical-vapor deposition (CVD) over the dielectric layer 56 and, as shown, substantially fills the remainder of the space in the trenches 55a and 55b. The polysilicon layer can be further doped with impurities so as to increase the conductivity thereof. The conductive layer 58 serves as a top plate (electrode) of the data storage capacitor of the DRAM cell.

In summary, the bottom plate 53 (the two conductive layers 48 and 52 in combination), the dielectric layer 56, and the further (third) conductive layer 58 in combination form a capacitive structure for the DRAM cell, serving as the data storage capacitor. More particularly, the double-trench structure 55a, 55b in the data storage capacitor increases the surface area of the bottom plate 53 so that the capacitance of the data storage capacitor is increased.

The invention has been described using exemplary preferred embodiments. However, it is to be understood that the scope of the invention is not limited to the disclosed preferred embodiments. On the contrary, it is intended to cover various modifications and similar arrangements as would be apparent to those of skilled in the art. The scope of the claims should be accorded the broadest interpretation so as to encompass all such modifications and similar arrangements.

What is claimed is:

1. A method of forming a data storage capacitor in a DRAM cell, comprising the steps of:

(a) providing a semiconductor substrate having at least one MOS transistor including a pair of source/drain regions formed thereon, and a first insulating layer formed over the said MOS transistor, with said first insulating layer having an opening to expose one of said source/drain regions;

(b) forming a first conductive layer over said first insulating layer and completely filling said opening;

(c) forming an insulating hump directly on said first conductive layer and centered over said opening;

(d) forming a second conductive layer on the outer surface of the substrate to cover said first conductive layer and said insulating hump;

(e) on the second conductive layer, forming only one pair of insulating material spacers which are disposed on and adjacent to sidewalls of a protruding part of said second conductive layer that covers said insulating hump;

(f) using said spacers and said insulating hump as an etching mask, anisotropically etching exposed portions of said second conductive layer and an underlying portion of said first conductive layer to remove all parts of said first and second conductive layers which are outside of said spacers and to form only one pair of trenches extending into said first conductive layer to a given depth inside a region surrounded by the spacer;

(g) removing said spacers and said insulating hump;

(h) forming a dielectric layer on the outer surface of said substrate to cover remaining parts of said first and second conductive layers; and (i) forming a third conductive layer over said dielectric layer, whereby remaining parts of said first and second conductive layers, said dielectric layer, and said third conductive layer in combination constitute a data storage capacitor of a DRAM cell.

2. The method of forming a data storage capacitor in a DRAM cell according to claim 1 wherein said step of forming an insulating hump comprises: forming a second insulating layer over said first conductive layer; and selectively etching said second insulating layer to remove portions thereof and form said insulating hump.

3. The method of forming a data storage capacitor in a DRAM cell according to claim 2, wherein said second insulating layer is a silicon dioxide layer.

4. The method of forming a data storage capacitor in a DRAM cell according to claim 2, wherein said step of selectively etching said second insulating layer is an anisotropic etching process.

5. The method of forming a data storage capacitor in a DRAM cell according to claim 1, wherein said spacer is made of silicon dioxide.

6. The method of forming a data storage capacitor in a DRAM cell according to claim 1, wherein said dielectric layer is a silicon nitride/silicon dioxide (NO) layer.

7. The method of forming a data storage capacitor in a DRAM cell according to claim 1, wherein said dielectric layer is a $Ta_2O_5$ layer.

8. The method of forming a data storage capacitor in a DRAM cell according to claim 1, wherein said first conductive layer is a doped polysilicon layer.

9. The method of forming a data storage capacitor in a DRAM cell according to claim 1, wherein said second conductive layer is a doped polysilicon layer.

10. The method of forming a data storage capacitor in a DRAM cell according to claim 1, wherein said third conductive layer is a doped polysilicon layer.

11. A method of forming a data storage capacitor in a DRAM cell, comprising the steps of:

(a) providing a semiconductor substrate having formed thereon at least one MOS transistor including a pair of source/drain regions, and a first oxide layer formed over said MOS transistor, with said first oxide layer having an opening to expose one of said source/drain regions;

(b) forming a first conductive polysilicon layer over said first oxide layer and completely filling said opening;

(c) forming a second oxide layer directly on said first conductive polysilicon layer over said opening;

(d) selectively etching the surface of the substrate to remove selected parts of said second oxide layer to form an oxide hump directly on said first conductive polysilicon layer and centered over said opening;

(e) forming a second conductive polysilicon layer over said first conductive polysilicon layer and said oxide hump;

(f) on the second conductive layer, forming only one pair of insulating material spacers which are disposed on and adjacent to sidewalls of a protruding part of said second conductive polysilicon layer that covers said oxide hump;

(g) using said spacers and said oxide hump as an etching mask, anisotropically etching exposed portions of said second conductive polysilicon layer and an underlying portion of said first conductive polysilicon layer to remove all parts of said first and second conductive polysilicon layers which are outside of said spacers and to form only one pair of trenches extending into said first conductive polysilicon layer within a region surrounded by the spacers and between the spacers and the oxide hump;

(h) removing said spacers and said oxide hump;

(i) forming a dielectric layer on the outer surface of the substrate to cover remaining parts of said first and second conductive polysilicon layers; and (j) forming a third conductive polysilicon layer over said dielectric layer, whereby remaining parts of said first and second conductive polysilicon layers, said dielectric layer, and said third conductive polysilicon layer in combination constitute a data storage capacitor of a DRAM cell.

12. The method of forming a data storage capacitor in a DRAM cell according to claim 11, further comprising a step of doping impurities into said first conductive polysilicon layer.

13. The method of forming a data storage capacitor in a DRAM cell according to claim 11, further comprising a step of doping impurities into said second conductive polysilicon layer.

14. The method of forming a data storage capacitor in a DRAM cell according to claim 11, further comprising a step of doping impurities into said third conductive polysilicon layer.

15. The method of forming a data storage capacitor in a DRAM cell according to claim 11, wherein said dielectric layer is one of a silicon nitride/silicon dioxide (NO) layer.

16. The method of forming a data storage capacitor in a DRAM cell according to claim 11, wherein said dielectric layer is a $Ta_2O_5$ layer.

17. A method of forming a data storage capacitor in a DRAM cell, comprising the steps of:

(a) providing a semiconductor substrate having at least one MOS transistor including a pair of source/drain regions formed thereon, and a first insulating layer formed over said MOS transistor, with said first insulating layer having an opening to expose one of said source/drain regions;

(b) forming a first conductive layer over said first insulating layer and filling said opening;

(c) forming an insulating hump, consisting of only a single layer of material, directly on said first conductive layer and centered over said opening;

(d) forming a second conductive layer on the outer surface of the substrate to cover said first conductive layer and said insulating hump;

(e) on the second conductive layer, forming only one pair of insulating material spacers which are disposed on and adjacent to sidewalls of a protruding part of said second conductive layer that covers said insulating hump;

(f) using said spacers and said insulating hump as an etching mask, anisotropically etching exposed portions of said second conductive layer and an underlying portion of said first conductive layer to remove all parts of said first and second conductive layers which are outside of said spacers and to form a pair of trenches extending into said first conductive layer to a given depth inside a region surrounded by the spacers, wherein sidewalls of the insulating hump are exposed;

(g) removing said spacers and said insulating hump;

(h) forming a dielectric layer on the outer surface of said substrate to cover remaining parts of said first and second conductive layers; and (i) forming a third conductive layer over said dielectric layer, whereby remaining parts of said first and second conductive layers, said dielectric layer, and said third conductive layer in combination constitute a data storage capacitor of a DRAM cell.

18. The method of forming a data storage capacitor in a Dram cell according to claim 17, wherein the first conductive layer completely fills said opening.

19. A method of forming a data storage capacitor in a DRAM cell, comprising the steps of:

(a) providing a semiconductor substrate having formed thereon at least one MOS transistor including a pair of source/drain regions, and a first oxide layer formed over said MOS transistor, with said first oxide layer having an opening to expose one of said source/drain regions;

(b) forming a first conductive polysilicon layer over said first oxide layer and filling said opening;

(c) forming a second oxide layer directly on said first conductive polysilicon layer over said opening;

(d) selectively etching the surface of the substrate to remove selected parts of said second oxide layer to form an oxide hump directly on said first conductive polysilicon layer and centered over said opening, with the oxide hump consisting of only a single layer of oxide;

(e) forming a second conductive polysilicon layer over said first conductive polysilicon layer and said oxide hump;

(f) on the second conductive layer, forming only one pair of insulating material spacers which are disposed on and adjacent to sidewalls of a protruding part of said second conductive polysilicon layer that covers said oxide hump;

(g) using said spacers and said oxide hump as an etching mask, anisotropically etching exposed portions of said second conductive polysilicon layer and an underlying portion of said first conductive polysilicon layer to remove all parts of said first and second conductive polysilicon layers which are outside of said spacers and to form a pair of trenches extending into said first conductive polysilicon layer within a region surrounded by the spacers and between the spacers and the oxide hump, and exposing sidewalls of the hump;

(h) removing said spacer and said oxide hump;

(i) forming a dielectric layer on the outer surface of the substrate to cover remaining parts of said first and second conductive polysilicon layers; and (j) forming a third conductive polysilicon layer over said dielectric layer, whereby remaining parts of said first and second conductive polysilicon layers, said dielectric layer, and said third conductive polysilicon layer in combination constitute a data storage capacitor of a DRAM cell.

* * * * *